(12) United States Patent
Devereaux

(10) Patent No.: US 6,911,357 B2
(45) Date of Patent: Jun. 28, 2005

(54) METHOD FOR WAFER LEVEL TESTING OF SEMICONDUCTOR USING SACRIFICIAL ON DIE POWER AND GROUND METALIZATION

(75) Inventor: Kevin M. Devereaux, Boise, ID (US)

(73) Assignee: Micron Technology, Inc., Boise, ID (US)

(*) Notice: Subject to any disclaimer, the term of this patent is extended or adjusted under 35 U.S.C. 154(b) by 15 days.

(21) Appl. No.: 10/175,856

(22) Filed: Jun. 21, 2002

(65) Prior Publication Data

US 2003/0042600 A1 Mar. 6, 2003

Related U.S. Application Data

(62) Division of application No. 09/939,636, filed on Aug. 28, 2001, now Pat. No. 6,753,547.

(51) Int. Cl.[7] ............................................. H01L 21/82
(52) U.S. Cl. ..................... 438/132; 438/467; 438/601
(58) Field of Search ............................... 438/131, 132, 438/215, 281, 467, 333, 600, 601, FOR 433

(56) References Cited

U.S. PATENT DOCUMENTS

| 5,391,892 A | 2/1995 | Devereaux et al. |
| 5,859,792 A * | 1/1999 | Rondeau, II et al. ......... 365/52 |
| 5,923,047 A | 7/1999 | Chia et al. |
| 6,091,079 A | 7/2000 | Green et al. |

FOREIGN PATENT DOCUMENTS

JP          07092221 A  *  4/1995  ........... G01R/31/26

* cited by examiner

Primary Examiner—Paul E Brock, II
(74) Attorney, Agent, or Firm—Dickstein Shapiro Morin & Oshinsky LLP

(57) ABSTRACT

The present invention provides a method and apparatus which facilitates wafer level burn-in testing of semiconductor dies. Sacrificial busses on the wafer supply voltage to respective on die Vcc and Vss sacrificial voltage pads during burn-in testing. The Vcc sacrificial pad on each die is connected to a secondary Vcc pad through an on-die sacrificial metal bus. An on-die fuse is interposed between the secondary Vcc pad and a normal Vcc die bonding pad. The fuse will blow when a die draws excessive current isolating a defective die from other dies on the wafer which are connected to the sacrificial busses. The Vss sacrificial pad is connected to a normal Vss die bonding pad through a sacrificial metal bus. After burn-in testing, the structures are removed. During this removal, the on-die sacrificial metal busses protect the secondary Vcc pad and Vss bonding pad. The secondary Vcc pad, Vcc bonding pad and Vss bonding pad can then be exposed for additional die testing.

13 Claims, 5 Drawing Sheets

METHOD FOR WAFER LEVEL TESTING OF SEMICONDUCTOR USING SACRIFICIAL ON DIE POWER AND GROUND METALIZATION

This application is a divisional of application Ser. No. 09/939,636, filed on Aug. 28, 2001, U.S. Pat. No. 6,753,547 which is hereby incorporated by reference.

FIELD OF THE INVENTION

This invention relates generally to the fabrication and testing of semiconductor dies before the dies are cut from fabricated wafers.

BACKGROUND OF THE INVENTION

Semiconductor dies are manufactured from wafers by fabricating, testing and dicing of the dies. Dies, also known as "chips", contain the finished circuitry of semiconductor components, e.g. processors, memory circuits and others. Not all fabricated dies present on a wafer are operable and thus individual dies must be tested and defective dies discarded.

On wafer burn-in testing is one type of test typically used to separate good and bad dies. For the wafer tests, voltage busses Vcc and Vss are often fabricated over a protection passivation layer for the wafer. The protective layer is also selectively etched to expose Vcc and Vss conductive pads on the individual dies which are electrically connected to the Vcc and Vss voltage busses that run across the wafer. This bus and pad structure supplies power to the dies during the wafer burn-in tests. The Vcc and Vss voltage busses can be located in the street area between dies or over the top of dies covered with protective layer.

During wafer level testing, fuses are respectively associated with the dies and are used to isolate a die which is defective and draws excessive current from one or both of the Vcc and Vss busses. In this way, a die drawing excessive current during the on-wafer testing can be disconnected by a blown fuse from the busses and not affect the testing of other dies.

The wafer level testing is typically conducted in a furnace to temperature stress the dies during burn-in testing to check for defects. A series of predetermined voltages may also be applied to the dies during the burn-in test, through the Vcc and Vss busses, in an effort to detect dies which will not operate properly within design specifications under various temperature conditions. The fuses associated with each die are blown automatically when excessive current is drawn or manually when an over-current or latch up condition is detected within a die. (Latchup is a condition where the die circuits lock up and draws damaging levels of high current)

The fuses are important in isolating a defective die from other dies connected to the Vcc and Vss busses during die testing. Typically, sacrificial fuses are provided as part of the sacrificial Vcc and Vss bus structure over the dies or in the street areas between dies. Etching away sacrificial fuses from dies after burn-in complicates post burn-in identification of defective dies. Additional time is required to test each die for high current condition defects rather than a simple continuity check of a die fuse.

Another problem is that existing die processing and testing methods also do not adequately protect non-sacrificial on-die structures during subsequent etching of bonding pads used for electrical connection to the die. Extensive precautions and effort must be undertaken to avoid damaging non-sacrificial components when the sacrificial components are etched away.

SUMMARY OF THE INVENTION

The present invention provides a method and apparatus which mitigates problems associated with sacrificial fuses and the undesired etching of non-sacrificial die structures when the sacrificial die test bus structure is removed. In the invention, a first and second sacrificial busses are applied to a wafer and used to supply a first and second voltage (Vcc and Vss) through openings in a passivation layer atop the dies to respective on die Vcc and Vss sacrificial voltage pads. The sacrificial pads are connected to a non-sacrificial standard or secondary on-die voltage pad through a sacrificial metal bus which is only partially etched away when the sacrificial busses are removed thereby providing protection for the non-sacrificial die structures. A fuse is interposed on each die between the standard and secondary voltage pads. A standard voltage pad (e.g. ground or power) is connected to die terminal voltage pins for supplying power and ground voltage (or a first and second voltage) to the die. The fuse will blow when a die draws excessive current during wafer level tests thereby isolating a defective die from the wafer sacrificial voltage busses Vcc and Vss. After burn-in, the sacrificial Vcc and Vss busses, sacrificial die pads and a portion of the on-die sacrificial metal busses are removed from the wafers and the passivation layer is etched to provide an opening to standard and secondary on-die voltage pads of each die. Post burn-in testing and defective die identification can then be accomplished as the sacrificial on-die fuses can continue to be used to isolate dies and identify defective dies by a fuse being blown, after the sacrificial etching. In addition, the on-die voltage pads, which are protected during the sacrificial etching, continue to be available for test probing and conductor bonding.

BRIEF DESCRIPTION OF THE DRAWINGS

These and other features and advantages of the invention will be better understood from the following detailed description which is provided in connection with the accompanying drawings.

DETAILED DESCRIPTION OF THE INVENTION

The present invention offers several advantages over the prior art. First, the fuse is placed on the live die rather than in a sacrificial metal layer. This allows for fuse testing and associated verification that the die was burned-in and did not latch-up even after the sacrificial metal layer is removed. Second, by placing the fuse on the live die, the thickness of the sacrificial metal layer can be adjusted without affecting the electrical threshold (breakdown current) for blowing the fuse. The use of the sacrificial metal bus, which is only partially etched upon removal of the sacrificial metal layer, allows for a buffer between the etched and non-etched non-sacrificial components such as the standard or secondary voltage pads. Also, the use of on-die voltage pads in combination with a fuse which is present after the sacrificial metal layer is removed, provides the ability to perform additional testing by application of voltage through the non-sacrificial on-die voltage pads with continued protection against latch-up or excessive current events and a continuing ability to identify defective dies with a single continuity check of the fuse.

Figure 1A:
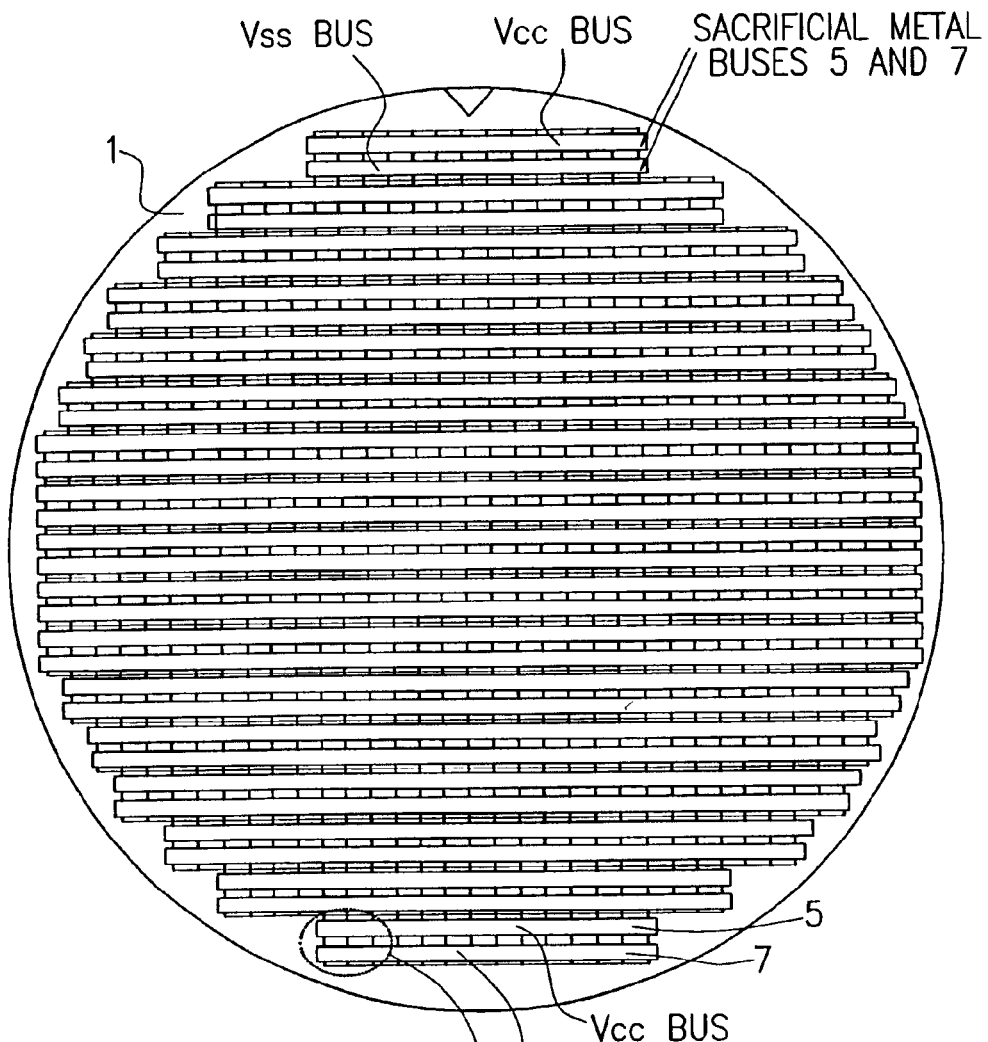
FIG. 1a shows a plan view of a plurality of semiconductor dies on a wafer which are constructed in accordance with an exemplary embodiment of the invention.

An exemplary embodiment of the invention is now described with reference to FIGS. 1–5. FIG. 1a shows a wafer 1 containing a plurality of fabricated dies 3. A sacrificial metal layer patterned as a plurality of alternating sacrificial metal busses for a Vcc voltage (5) and a ground voltage Vss (7) are provided across the top surface of the wafer 1 and over the dies 3.

Figure 1B:
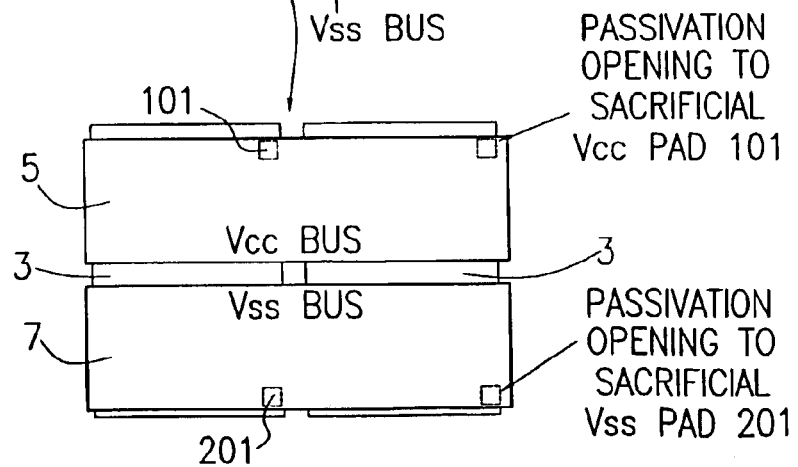
FIG. 1b shows a plan view of a pair of semiconductor dies on the FIG. 1a wafer.

FIG. 1b shows an expanded view of a Vcc 5 and Vss 7 bus which are provided over two adjacent dies 3. The bus metalization extends downwards through passivation layer openings in each die to on die sacrificial Vcc pads 101 and Vss pads 201.

Figure 2:
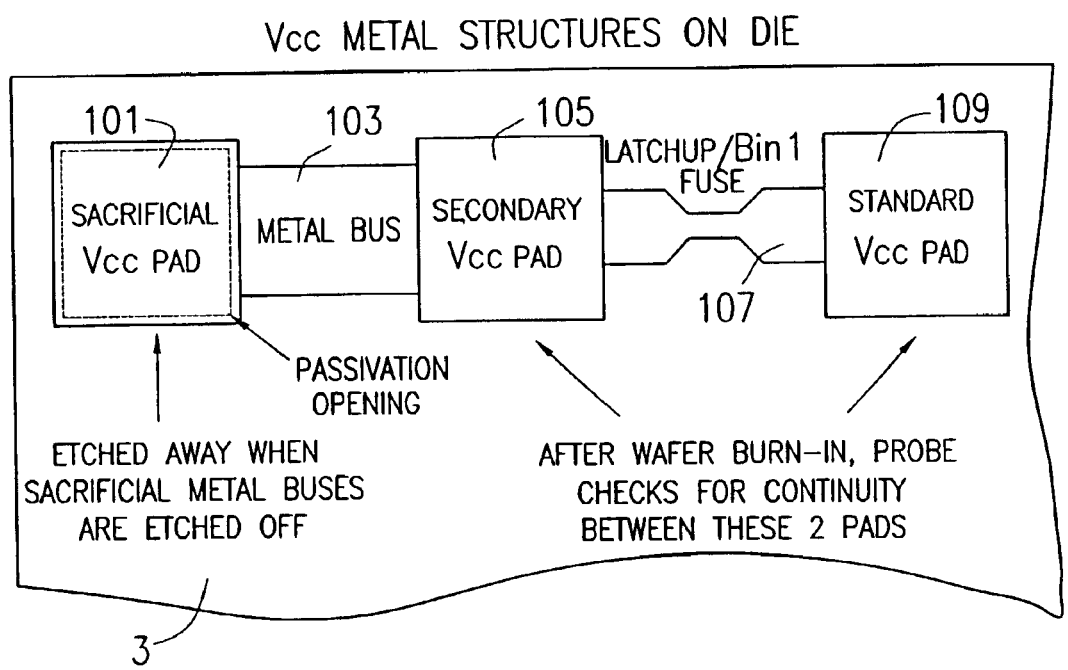
FIG. 2 shows in plan view a Vcc conductive path of a die constructed in accordance with an exemplary embodiment of the invention.

Referring to FIG. 2, each die has a Vcc metalization path which includes three bonding pads, namely, a standard (normal) Vcc pad 109, a secondary Vcc pad 105 connected to the standard Vcc pad 109 through a fuse 107 and a sacrificial Vcc pad 101 connected to the secondary Vcc pad 105 through a metal bus 103. The pads 101, 105 and 109 are enlarged electrical connections which are used during various procedures.

The standard Vcc pad 109 is a bond pad normally fabricated as part of the die 3 which is used to receive an external Vcc voltage and apply it to internal circuitry within a die 3. The secondary Vcc pad 105 is also fabricated on a die 3 and is connected to the standard Vcc pad 109 through a fuse 107 that is designed to blow in the event that a die 3 draws excessive current, for example, when a latch-up condition or other excessive current draw conditions which occur during wafer level burn-in testing.

The sacrificial Vcc pad 101 supplies voltage to the die 3 during wafer level burn-in testing. This pad is etched away when the sacrificial metal layer, which forms the Vcc 5 and Vss 7 busses, is removed from the wafer. Sacrificial Vcc pad 101 is connected to secondary Vcc pad 105 through an on-die sacrificial metal Vcc bus 103 that is also partially removed when the Vcc 5 and Vss 7 busses are removed from the wafer. The sacrificial bus 103 protects the secondary Vcc pad 105 from being damaged when the sacrificial metal busses Vcc 5 and Vss 7 and the sacrificial Vcc pad 101 are etched away. The sacrificial metal bus 103 thus serves as a horizontal buffer for the secondary Vcc pad 105 when the sacrificial Vcc pad 101 is removed along with Vcc 5 and Vss 7 busses from the wafer.

Figure 3:
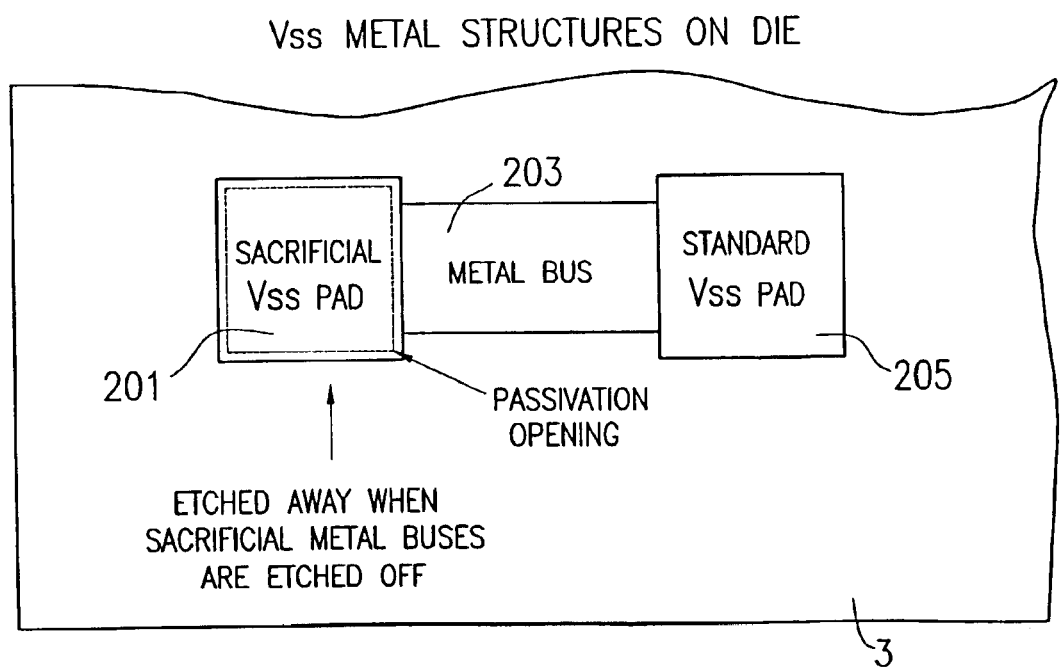
FIG. 3 shows in plan view a Vss conductive path of a die constructed in accordance with an exemplary embodiment of the invention.

Referring to FIG. 3, a Vss (ground) metalization path is provided on each die and includes two pads. The first pad is the standard (normal) Vss bond pad 205 which is provided on a die 3 to supply Vss voltage to the internal components of the die. The standard Vss pad 205 is connected to a sacrificial Vss pad 201 through another on-die sacrificial metal bus 203. The sacrificial Vss pad 201 and a portion of the sacrificial metal bus 203 are etched away when the Vcc 5 and Vss 7 busses are removed from the wafer. The sacrificial metal bus 203 provides a horizontal buffer which protects the standard Vss pad 205 from being damaged when the sacrificial metal layers Vcc 5 and Vss 7 and sacrificial pad 201 are removed from the wafer.

Figure 4A:
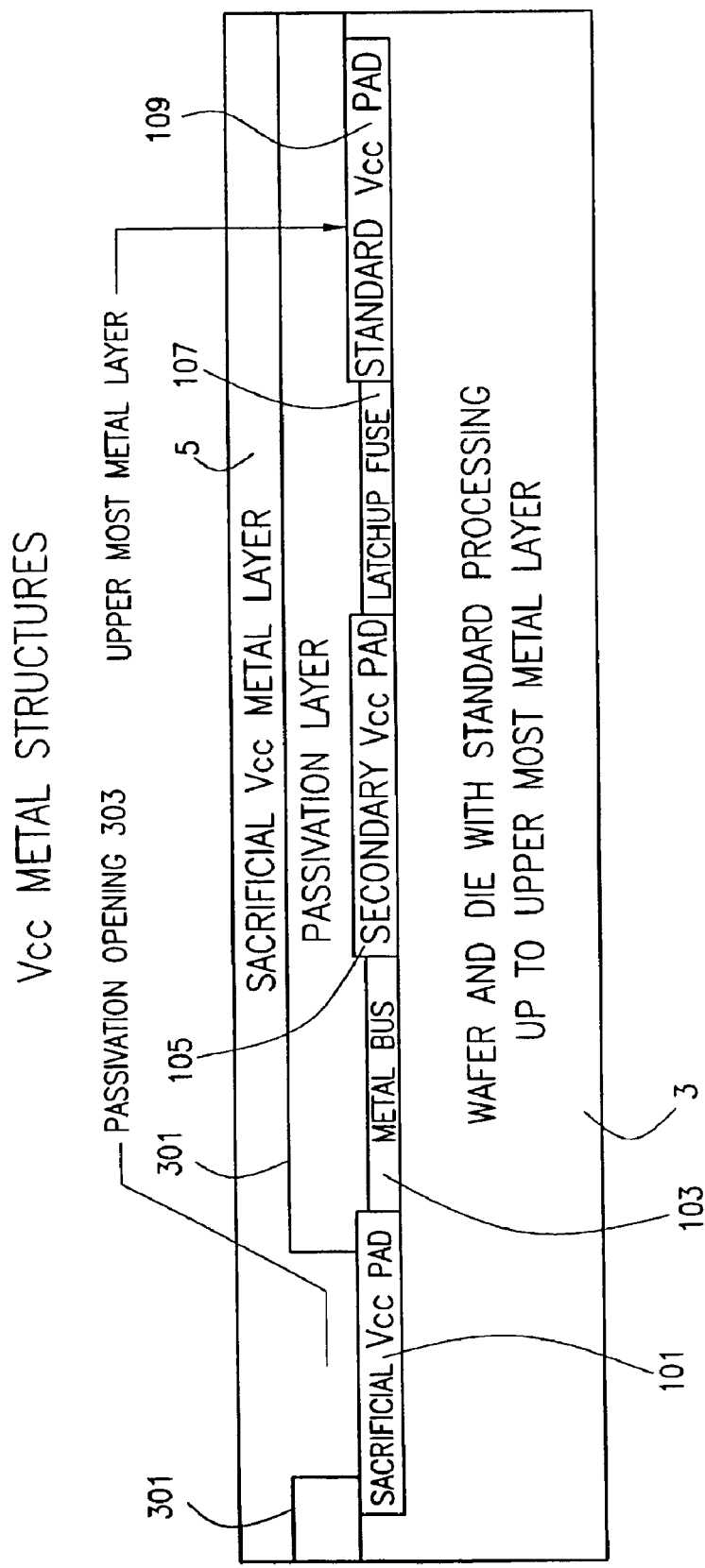
FIG. 4a shows a cross section of the Vcc conductive path of a die constructed in accordance with an exemplary embodiment of the invention.

Referring to FIG. 4a, a cross section of the uppermost layers of an exemplary die 3 with passivation and sacrificial Vcc metal layers provided for burn-in testing is shown. The passivation layer 301 covering the die 3 is etched to create a passivation opening 303 which exposes the sacrificial Vcc pad 101. A sacrificial Vcc metal layer 5 is provided atop the passivation layer 301 and is extended down to the sacrificial Vcc pad 101 through the passivation opening 303 on each die 3.

Figure 4B:
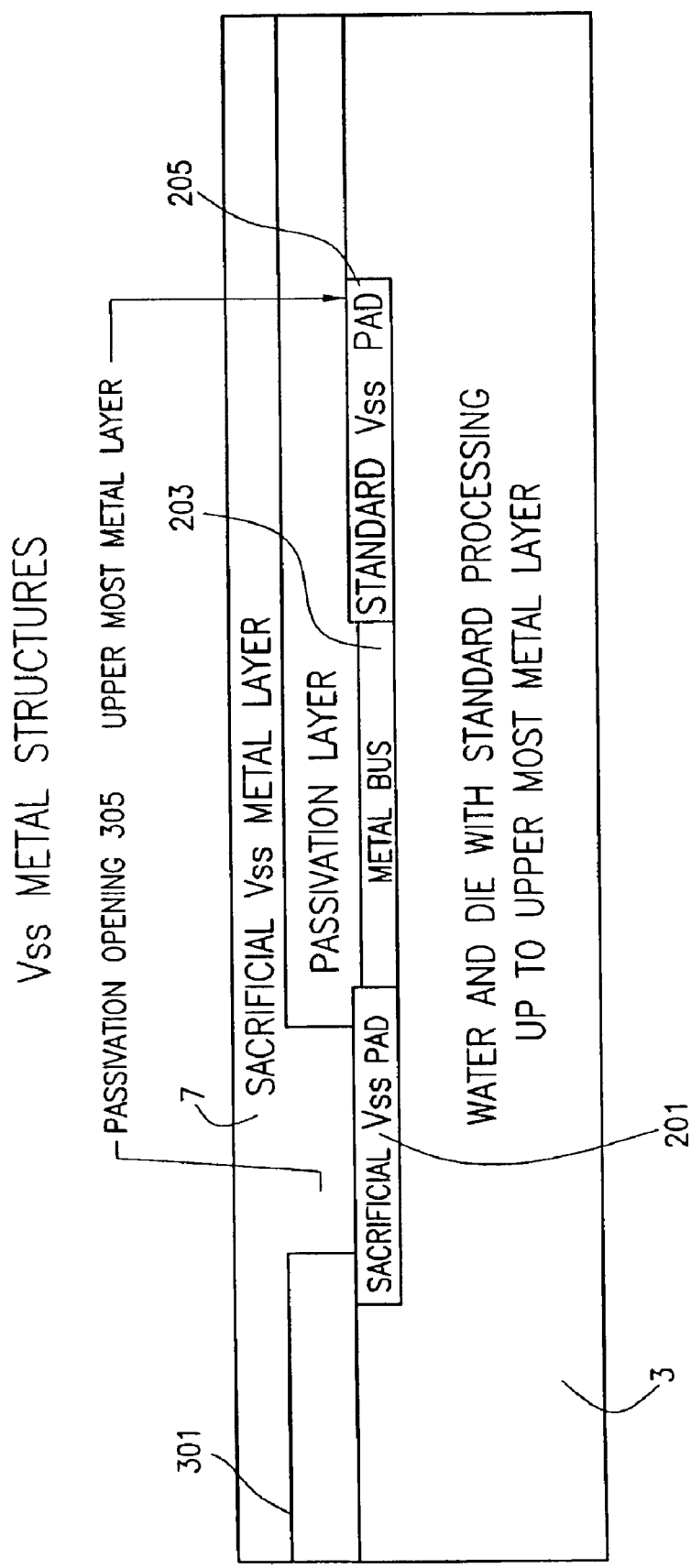
FIG. 4b shows a cross section of the Vss conductive path of a die constructed in accordance with an exemplary embodiment of the invention.

Referring to FIG. 4b, a cross section of the uppermost layers of the die 3 with passivation and sacrificial Vss metal structures provided for burn-in testing is shown. The passivation layer covering the die 301 is etched to create a passivation opening 305 which exposes the sacrificial Vss pad 201. A sacrificial Vss metal layer 7 is provided atop the passivation layer 301 and is extended down to the sacrificial Vss pad 201 through the Vss passivation opening 305.

Figure 5:
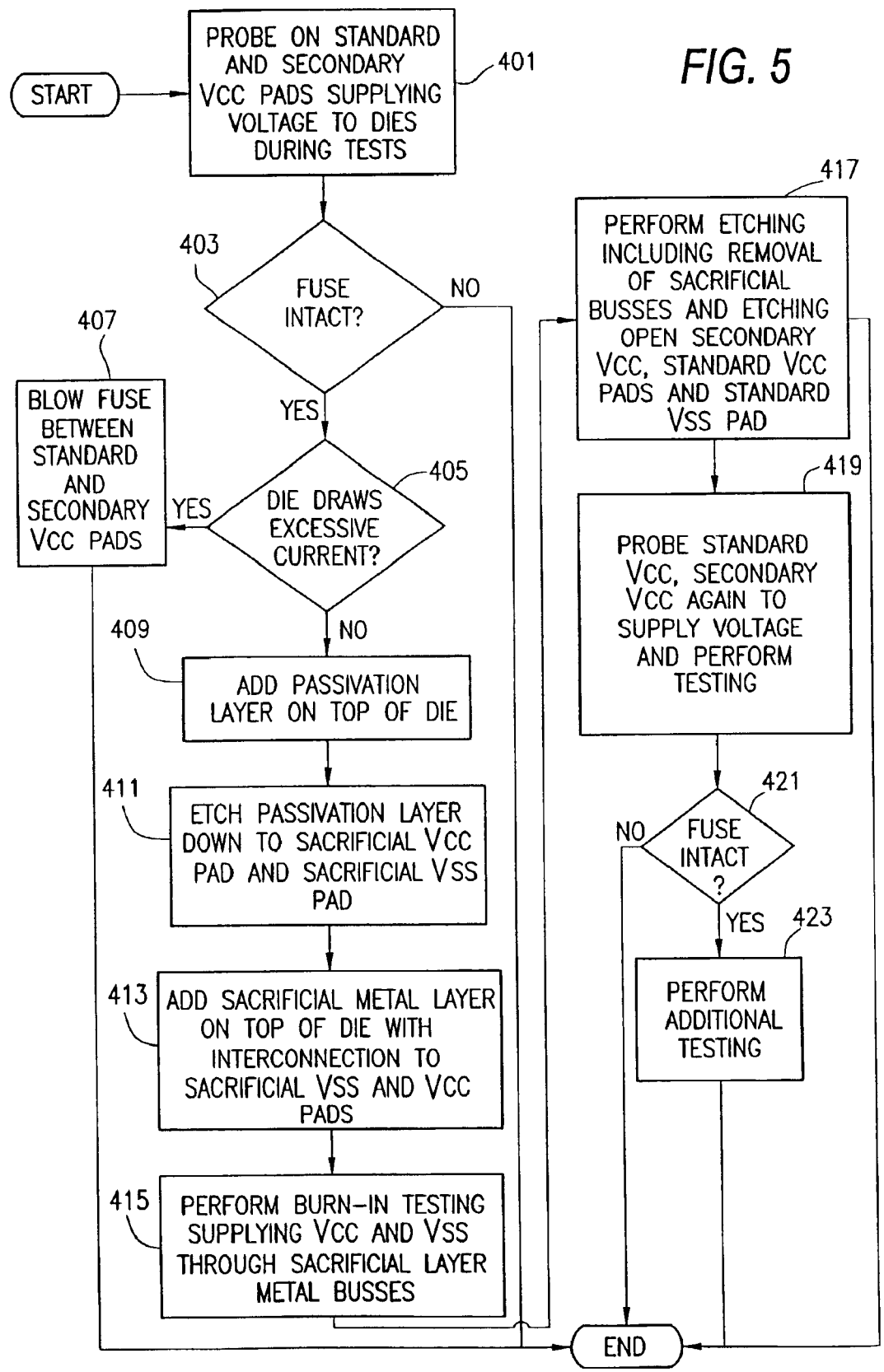
FIG. 5 shows a processing sequence for processing and testing a semiconductor wafer containing a plurality of integrated circuit dies constructed in accordance with an exemplary embodiment the invention.

Referring to FIG. 5, one processing sequence for processing and testing a semiconductor wafer 1 containing an array of dies 3 is disclosed. First, in processing segment 401, a first voltage probe is connected to a first voltage terminal 105 and a second voltage probe is connected to a second voltage terminal 109. Next, in processing segment 403, test equipment attached to the first and second probes checks for continuity between the first voltage terminal 105 and second voltage terminal 109 thereby detecting if the fuse 107 is intact. If the fuse 107 is not intact, testing for that die 3 is terminated. If the fuse 107 is intact, then testing continues with probe equipment testing to determine if there is excess current draw in a tested die between terminal 105 and terminal 109 in segment 405. If excess current draw is detected, fuse 107 will blow automatically if sufficient excess current is drawn through the fuse by the die 3. If fuse 107 is not blown automatically and excess current is detected, then the test equipment will blow the fuse 107 by applying sufficient voltage across the first terminal 105 and second terminal 109 in processing segment 407, then the die test processing will terminate. This process is conducted for all dies on a wafer 1 either simultaneously or sequentially until all dies are tested. Then a passivation layer 301 will be provided on top of the wafer 1 covering the sacrificial Vcc pad 101, metal bus 103, secondary Vcc pad 105, fuse 107 and standard Vcc pad 109 as well as the sacrificial Vss pad 201, Vss metal bus 203 and standard Vss pad 205 of all dies 3 during processing segment 409. Next, etching of the passivation layer 301 down to sacrificial Vcc pad 101 and sacrificial Vss pad 201 occurs for all dies in processing segment 411. A sacrificial metal layer will next be added in processing segment 413 on top of the passivation layer 301 over the wafer to provide a plurality of alternating Vcc and Vss busses 5, 7 which are respectively connected to the sacrificial Vcc pads 101 and Vss pads 201 on the dies. Next, in processing segment 415, burn-in testing is conducted with die voltage being provided from the Vcc and Vss busses 5, 7 to the sacrificial Vcc pad 101 and Vss pad 201 on each die 3. During such testing, fuses 107 may be blown for any dies drawing excessive current.

When the wafer level burn-in testing is complete, the sacrificial pads 101, 201 and sacrificial Vcc, Vss busses 5, 7 will be etched away leaving the passivation layer 301 and openings where the sacrificial pads 101, 201 are etched. During this etching the metal busses 103, 203 provide a horizontal buffer and protect the secondary Vcc pad 105 and standard Vss pad 205 from being etched. After the sacrificial metal layer 5, 7 and pads 101, 201 are removed, openings are etched through the passivation layer 301 to the secondary Vcc pad 105, the standard Vcc pad 109 and the standard Vss pad 205 on each die in processing segment 417. A first test probe can be applied to the exposed secondary Vcc pad 105, a second test probe can be applied to the exposed standard Vcc pad 109 and a third test probe can be applied to the standard Vss pad 205 of each die 3 in processing segment 419. Test equipment will supply voltage and ground to a die 3 across the pads 105, 109 at processing segment 421. Test equipment attached to the probes will also check for continuity between the pads 105 and 109 at processing segment 421 thereby testing if the fuse 107 is intact on a given die 3. If the fuse 107 is intact, then test equipment will continue with additional testing at processing segment 423. If the fuse 107 is not intact, then testing on the die 3 will terminate.

Individual dies can be tested one at a time or a plurality of dies may be tested simultaneously. If single dies are tested, then when a defective die is found, processing of the die is terminated and test equipment will move on to begin testing the next die in the test protocol. If multiple dies are tested at the same time, then testing will terminate on the defective dies with testing on other dies continuing.

The invention thus provides a unique die structure which provides the fuses used in wafer level testing directly on the dies and a sacrificial pad structure which protects the normal die pads from being etched when the sacrificial pads and sacrificial Vcc and Vss busses are removed. While exemplary embodiments of the invention have been described and illustrated, the present invention is not to be considered as limited by such descriptions and illustrations but is only limited by the scope of the appended claims.

What is claimed is:

1. A method of fabricating an integrated circuit die comprising:
   forming a first terminal on said die which is coupled to circuitry within said die, said first terminal being adapted to supply a first voltage to said circuitry;
   forming a second terminal adapted to supply said first voltage to said first terminal;
   forming a voltage interruption device between said first and second terminals, said voltage interruption device being electrically connected to each of said first and second terminals and adapted to interrupt an electrical coupling between first and second terminals when predetermined operations of said circuitry occur; and
   forming a first sacrificial terminal for receiving a first voltage and supplying said first voltage to said second terminal.

2. A method of claim 1 further comprising forming a first on-die sacrificial conductive line coupled between the second terminal and the first sacrificial terminal.

3. A method of claim 2 further comprising:
   forming a third terminal on said die which is coupled to circuitry within said die said third terminal being adapted to supply a second voltage to said circuitry; and
   forming a second sacrificial terminal on said die for receiving a second voltage and supplying the second voltage to the third terminal.

4. A method of claim 3 further comprising forming a second sacrificial on-die conductive line coupled between the third terminal and second sacrificial terminal.

5. A method of claim 4, further comprising:
   forming a passivation layer over said die;
   forming openings through the passivation layer exposing first and second sacrificial terminals on each die; and
   forming a sacrificial metal layer over the passivation layer to provide a first conductive line connected to said first sacrificial terminal and a second conductive line connected to said second sacrificial terminal, the respective lines connecting to first and second sacrificial terminals through corresponding openings in the passivation layer.

6. A method of processing a semiconductor wafer containing at least one die comprising:
   supplying a first voltage to a first sacrificial conductive line and a second voltage to a second sacrificial conductive line, said sacrificial conductive lines being provided on said wafer and connected respectively to a first and second sacrificial terminal said at least one die;
   testing at least one die while said first and second voltage is applied;
   blowing a current interruption device provided on said at least one die when the current reaches a predetermined value;
   removing said first and second sacrificial conductive lines and the first and second sacrificial terminals;
   exposing on-die first and second terminals on said at least one die, said first and second terminals interconnected by said current interruption device; and
   testing the status of said current interruption device through said exposed first and second terminals.

7. A method of fabricating a die, said method comprising:
   forming a conductive structure on said die comprising:
   a first supply voltage bonding pad connected to die circuitry for receiving a first voltage;
   a secondary first supply voltage pad;
   a fuse interconnected between the first supply voltage bonding pad and the secondary first supply voltage pad, said fuse electrically connected to each of said first supply voltage bonding pad and said secondary first supply voltage pad;
   a sacrificial first supply voltage pad;
   a metal bus interconnecting the sacrificial first supply voltage pad and secondary first supply voltage pad;
   a secondary supply voltage bonding pad connected to die circuitry for receiving another voltage;
   a sacrificial secondary supply voltage pad; and
   a metal bus interconnecting the sacrificial secondary supply voltage pad and the secondary supply voltage pad.

8. The method of claim 7 further comprising:
   forming a passivation layer on the die;
   forming contact openings through passivation layer exposing the sacrificial first supply voltage and secondary supply voltage pads on each die; and
   forming a first supply voltage and secondary supply voltage sacrificial metal conductor over the passivation layer and into the openings respectively connecting with the first supply voltage and secondary supply voltage sacrificial pads.

9. The method of claim 8 further comprising testing said fabricated die, said testing comprising:

applying first supply voltage and secondary supply voltage respectively to said first supply voltage and secondary supply voltage sacrificial metal conductors; and blowing said fuse of said die which draws current in excess of a predetermined value.

10. The method as in claim 9 further comprising exposing said first supply voltage bonding pad and secondary first supply voltage pad and checking for fuse continuity between said pads.

11. The method as in claim 8 further comprising:

applying first supply voltage and secondary supply voltage respectively to said first supply voltage and secondary supply voltage sacrificial metal conductors; and testing said die while said first supply voltage and secondary supply voltage is applied.

12. The method of claim 11 further comprising:

removing the sacrificial first supply voltage and secondary supply voltage conductors;

removing the sacrificial first supply voltage and secondary supply voltage pads; and exposing the first supply voltage bonding pad, secondary first supply voltage pad and secondary supply voltage bonding pads on each die.

13. The method as in claim 12 further comprising testing the continuity of said fuse using said exposed first supply voltage bonding pad and secondary first supply voltage pad.

* * * * *